(12) United States Patent
Trobough et al.

(10) Patent No.: US 8,834,184 B2
(45) Date of Patent: Sep. 16, 2014

(54) SPACE AND COST EFFICIENT INCORPORATION OF SPECIALIZED INPUT-OUTPUT PINS ON INTEGRATED CIRCUIT SUBSTRATES

(75) Inventors: Mark B. Trobough, Olympia, WA (US); Christopher S. Baldwin, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/468,618

(22) Filed: May 10, 2012

(65) Prior Publication Data
US 2012/0322314 A1    Dec. 20, 2012

Related U.S. Application Data

(62) Division of application No. 12/384,634, filed on Apr. 6, 2009, now Pat. No. 8,212,350.

(51) Int. Cl.
*H01R 12/00* (2006.01)
*H05K 1/00* (2006.01)
*H01L 23/498* (2006.01)
*G01R 1/04* (2006.01)

(52) U.S. Cl.
CPC ........ *H01L 23/49838* (2013.01); *G01R 1/0483* (2013.01)
USPC .............................................. 439/75; 439/70

(58) Field of Classification Search
USPC ............................ 439/607.14, 607.33, 70, 75
See application file for complete search history.

(56) References Cited

U.S. PATENT DOCUMENTS

| | | | |
|---|---|---|---|
| 4,004,196 A | 1/1977 | Doucet | |
| 5,102,352 A | 4/1992 | Arisaka | |
| 5,702,256 A | 12/1997 | Severn | |
| 5,896,037 A | 4/1999 | Kudla et al. | |
| 6,667,561 B2 | 12/2003 | Baker | |
| 6,762,495 B1 * | 7/2004 | Reyes et al. | 257/737 |
| 6,940,093 B2 | 9/2005 | Eldridge et al. | |
| 8,212,350 B2 | 7/2012 | Trobough et al. | |
| 2001/0036063 A1 * | 11/2001 | Nagaya et al. | 361/729 |
| 2005/0285280 A1 * | 12/2005 | Yau | 257/786 |
| 2006/0267217 A1 | 11/2006 | Wong et al. | |
| 2010/0032820 A1 | 2/2010 | Bruennert et al. | |
| 2012/0248441 A1 | 10/2012 | Trobough et al. | |

FOREIGN PATENT DOCUMENTS

| | | |
|---|---|---|
| CN | 1328718 A | 12/2001 |
| CN | 100361052 | 1/2008 |
| JP | 8-292229 A | 5/1996 |
| JP | 8292229 A | 11/1996 |

OTHER PUBLICATIONS

Office Action received for received for United Kingdom Patent Application No. 1005725.5, mailed on Jan. 25, 2012, 2 pages.

(Continued)

*Primary Examiner* — Sheila V Clark
(74) *Attorney, Agent, or Firm* — International IP Law Group, PLLC

(57) ABSTRACT

In some embodiments an Integrated Circuit package includes a plurality of system functional pins, at least one system functional pin depopulation zone, and at least one non-system functional pin located in the at least one functional pin depopulation zone. Other embodiments are described and claimed.

6 Claims, 4 Drawing Sheets

(56) References Cited

OTHER PUBLICATIONS

Examination and search Report for received for United Kingdom Patent Application No. 1005725.5, mailed on Aug. 31, 2010, 7 pages.
Office Action receive for received for United Kingdom Patent Application No. 1005725.5, mailed on Jul. 27, 2011, 2 pages.
INTEL, "E88870 Scalable Node Controller (SNC) Datasheet". Aug. 2002, 240 pages.
Office Action received for received for Chinese Patent Application No. 201010180752.2, mailed on Aug. 4, 2011, 8 pages including 5 pages of English Translation.
Office Action received for United Kingdom Patent Application No. 1207158.5, mailed on Aug. 29, 2012, 7 pages.
"Intel® E8870 Scalable Node Controller (SNC) Datasheet", Intel Corporation, Aug. 2002, 240 pages.
Office Action received for German Patent Application No. DE 102010003659.5, mailed on Oct. 5, 2012, 7 pages of Office Action.
Office Action received for Chinese Patent Application No. 201010180752.2, mailed Jun. 5, 2012, 9 pages of Office Action including 5 pages of English Translation.

* cited by examiner

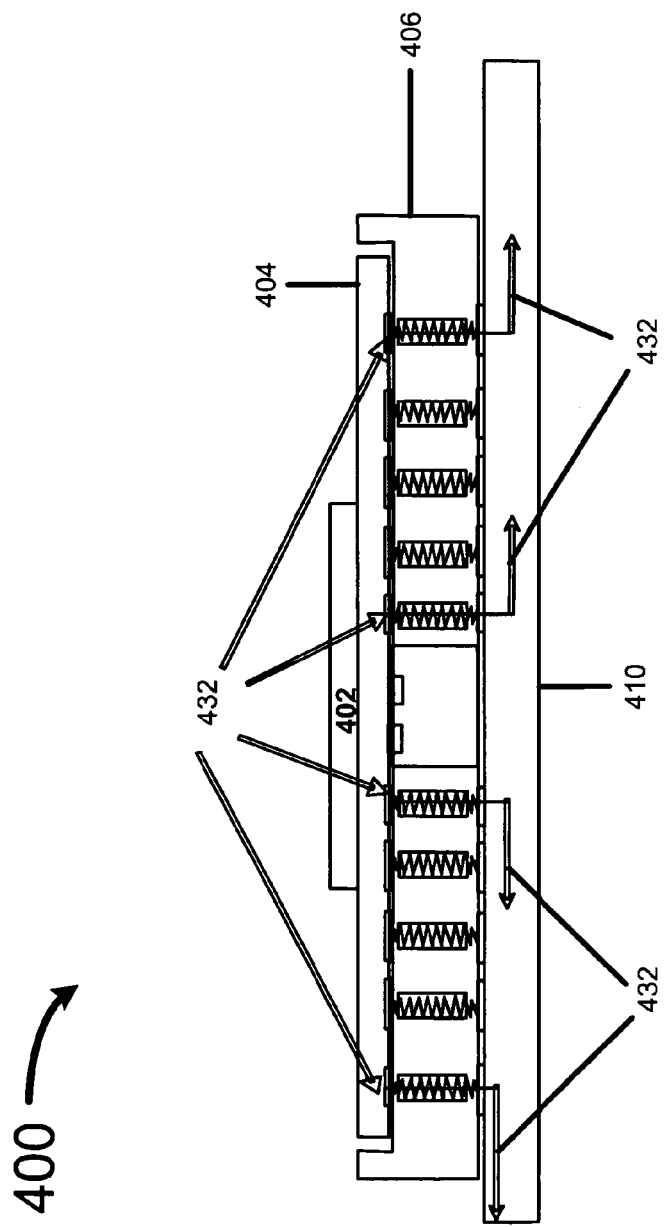

SPACE AND COST EFFICIENT INCORPORATION OF SPECIALIZED INPUT-OUTPUT PINS ON INTEGRATED CIRCUIT SUBSTRATES

CROSS REFERENCE TO RELATED APPLICATIONS

This application claims the benefit of U.S. patent application Ser. No. 12/384,634 titled "Space and Cost Efficient Incorporation of Specialized Pins on Integrated Circuit Substrates," filed Apr. 6, 2009 now U.S. Pat. No. 8,212,350, which is incorporated by reference herein.

TECHNICAL FIELD

The inventions generally relate to space and cost efficient incorporation of specialized pins on Integrated Circuit Substrates.

BACKGROUND

Test and debug pins are currently pinned out on Integrated Circuit (IC) packages such as Central Processing Unit (CPU) packages in the same available pin locations as the system functional signals. These test and debug pins must therefore be accounted for in the overall pin count budget imposed by a given pin count of a socket. This overall pin count budget is constrained by the package size as well as the need for proper mechanical "seating planes" to carry the large Land Grid Array (LGA) socket actuation forces. Therefore, they often impact the package size and the cost of the IC package.

BRIEF DESCRIPTION OF THE DRAWINGS

The inventions will be understood more fully from the detailed description given below and from the accompanying drawings of some embodiments of the inventions which, however, should not be taken to limit the inventions to the specific embodiments described, but are for explanation and understanding only.

FIG. 4 illustrates a system according to some embodiments of the inventions.

DETAILED DESCRIPTION

Some embodiments of the inventions relate to space and cost efficient incorporation of specialized pins on Integrated Circuit Substrates.

Some embodiments of the inventions relate to space and cost efficient incorporation of specialized signal pins (for example, Input-Output pins, test and debug pins, etc.) on Integrated Circuit Substrates.

In some embodiments an Integrated Circuit package includes a plurality of system functional pins, at least one system functional pin depopulation zone, and at least one non-system functional pin located in the at least one functional pin depopulation zone.

In some embodiments a socket includes a plurality of system functional pins, at least one system functional pin depopulation zone, and at least one non-system functional pin located in the at least one functional pin depopulation zone.

In some embodiments a system includes an Integrated Circuit package including a plurality of system functional pins, at least one system functional pin depopulation zone, and at least one non-system functional pin located in the at least one functional pin depopulation zone, a socket to receive system functional signals from the system functional pins of the integrated circuit package, and a stacked-socket interposer probe head assembly to receive a signal from the at least one non-system functional pin, and to pass the system functional signals from the Integrated Circuit package to the socket.

Figure 1:
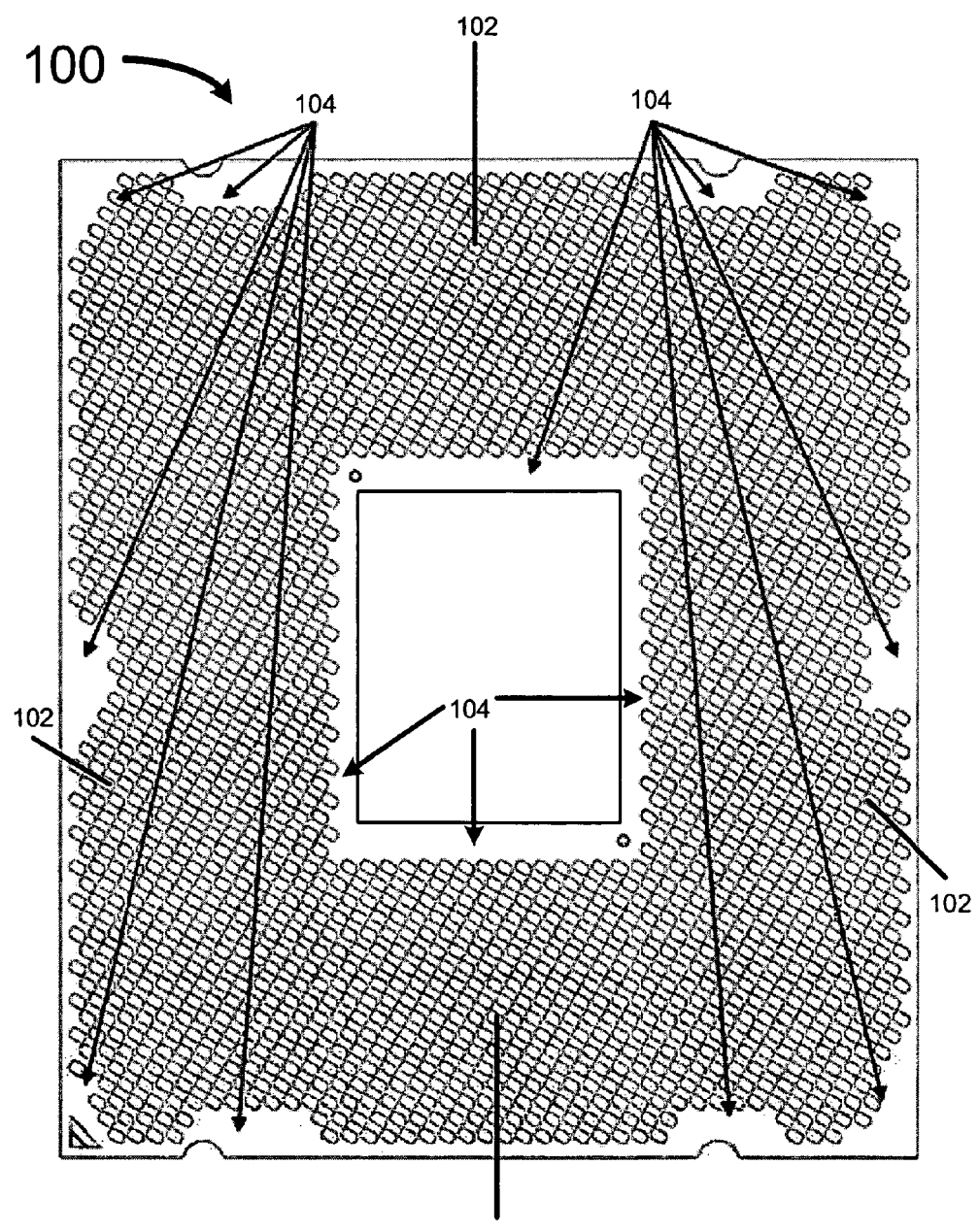
FIG. 1 illustrates a package according to some embodiments of the inventions.

FIG. 1 illustrates an Integrated Circuit (IC) package 100 according to some embodiments. In some embodiments IC package 100 is a processor package and/or a Central Processing Unit (CPU) package. In some embodiments IC package 100 includes a substrate having a pin array illustrated by pins 102. In some embodiments, pins 102 are system-functional pins needed for system functionality (for example, pins required for power, signaling for main buses and/or memory, etc.) Additionally illustrated in the IC package 100 of FIG. 1 is a plurality of pin depopulation zones 104. In some embodiments pin depopulation zones 104 are socket-side Land Grid Array (LGA) package substrate areas. Pin depopulation zones 104 are used, for example, to provide mechanical seating planes between the IC package and the LGA socket. For example, pin depopulation zones 104 may be used to create a mechanical force stop between the package and the socket when the package is forcefully mounted into the socket to make socket pin to package electrical contact. Pin depopulation zones 104 are therefore areas where no socket contacts reside, and the IC package 100 therefore does not have system-functional pins (such as pins 102) in these pin depopulation zones 104.

Figure 2:
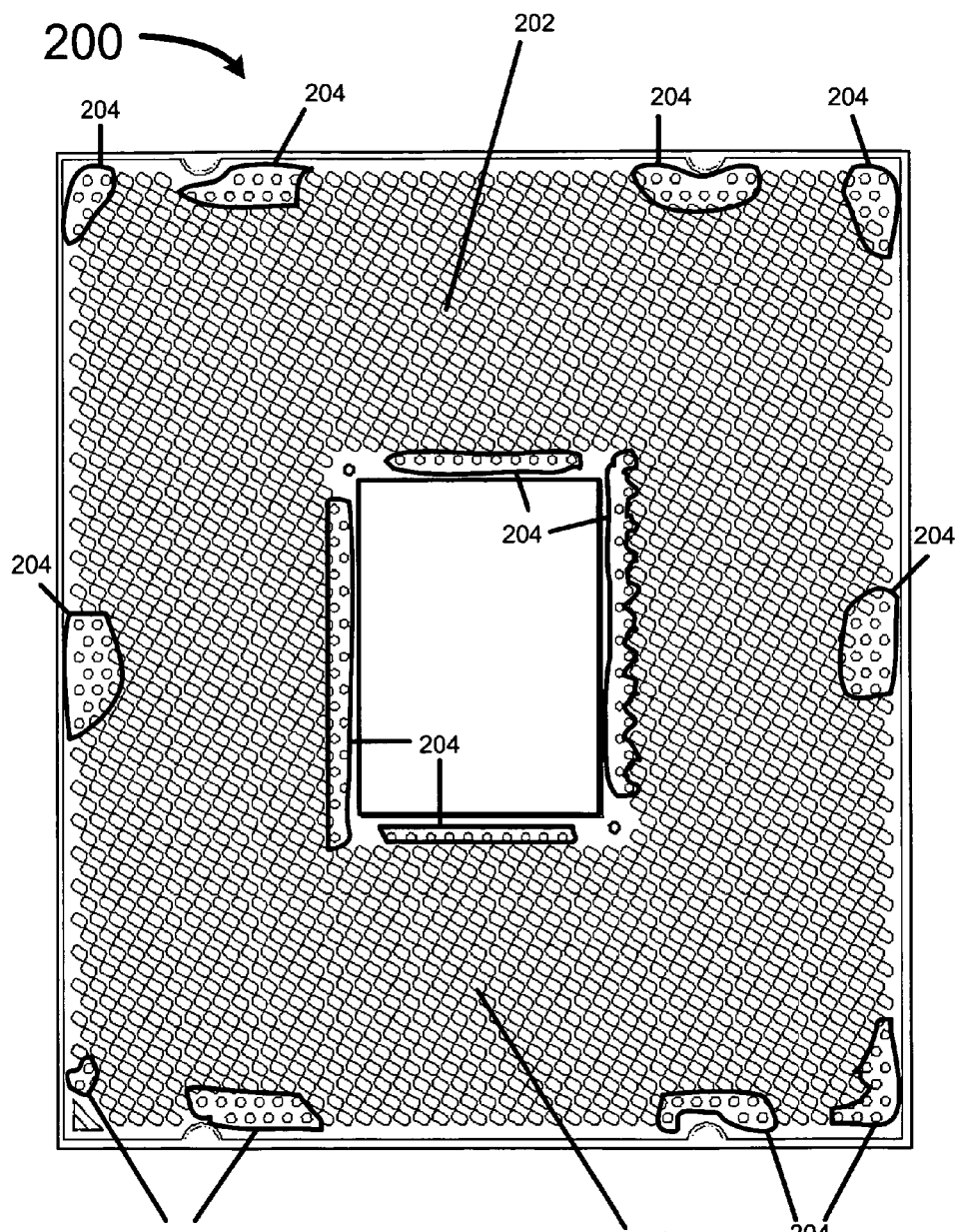
FIG. 2 illustrates a package according to some embodiments of the inventions.

FIG. 2 illustrates an Integrated Circuit (IC) package 200 according to some embodiments. In some embodiments IC package 200 is a processor package and/or a Central Processing Unit (CPU) package. In some embodiments IC package 200 includes a substrate having a pin array illustrated by pins 202 (for example, pins 202 are system-functional pins). Additionally illustrated in the IC package 200 of FIG. 2 is a plurality of pins 204 inserted in pin depopulation zones. In some embodiments these pin depopulation zones are socket-side Land Grid Array (LGA) package substrate areas. The pin depopulation zones in which pins 204 are inserted are used, for example, to provide mechanical seating planes between the IC package and the LGA socket. For example, the pin depopulation zones in which pins 204 are inserted may be used to create a mechanical force stop between the package and the socket when the package is forcefully mounted into the socket to make socket pin to package electrical contact. The pin depopulation zones in which pins 204 are inserted are therefore areas where no socket contacts reside, and the IC package 200 therefore does not have system-functional pins (such as pins 202) in these pin depopulation zones. However, pins 204 that are not system-functional pins may be inserted in pin depopulation zones according to some embodiments.

In some embodiments, pins 204 inserted in pin depopulation zones may include pins that are not system-functional pins. For example, in some embodiments, pins 204 inserted in pin depopulation zones may include Input-Output pins, debug pins, and/or test pins.

According to some embodiments, IC products (for example, CPU products) pin out several dedicated debug signals needed to validate and debug the product and enable market release of the product. Additionally, in some embodiments, IC products (for example, CPU products) include dedicated non-system-functional production test signals/pins that are critical to verifying the shipping product. Test and/or debug pins, which are in addition to system-functional pins, can number several dozen or more pins per IC product, can encompass a number of debug and test usage cases, and can constrain the reduction of package sizes to targeted cost levels.

In some embodiments, by placing pins 204 (for example, these types of test and/or debug pins) in pin depopulation zones, the package size and the cost can be minimized. The cost and size of the package is not increased by placing these types of pins in the pin depopulation zones according to some embodiments such as those illustrated in FIG. 2. Thus, according to some embodiments, package substrate areas referred to as pin depopulation zones are exploited by including the debug and/or test pins in those pin depopulation zones typically used to provide mechanical seating planes between the package and the socket.

Debug and test signals are typically included in the bottom side of a CPU package pin field, and have corresponding socket pins in the enabled test and debug socket. The placement of LGA signal pins on the CPU package substrate that correspond with the enabled socket's seating plane areas has not previously been implemented. These areas are typically only used as mechanically functional areas of the package. Currently used IC packages such as CPU packages do not locate signal pins of any type in the pin depopulation zones. Similarly, typical custom test and debug sockets do not have any pins located in the pin depopulation zones.

By placing non-system functional test and debug pins in pin depopulation zones on the package, the non-system functional pins do not count against the pin count budget of the package and do not impact package size and cost of the package substrate. That is, according to some embodiments, pin depopulation zones are a free substrate area that may be exploited. The large mechanical seating planes used by custom test and debug sockets do not make functional use of the pin depopulation areas of the package as mechanical stops. This is due to the contacting technology, which is not a cost constrained technology.

Figure 3:
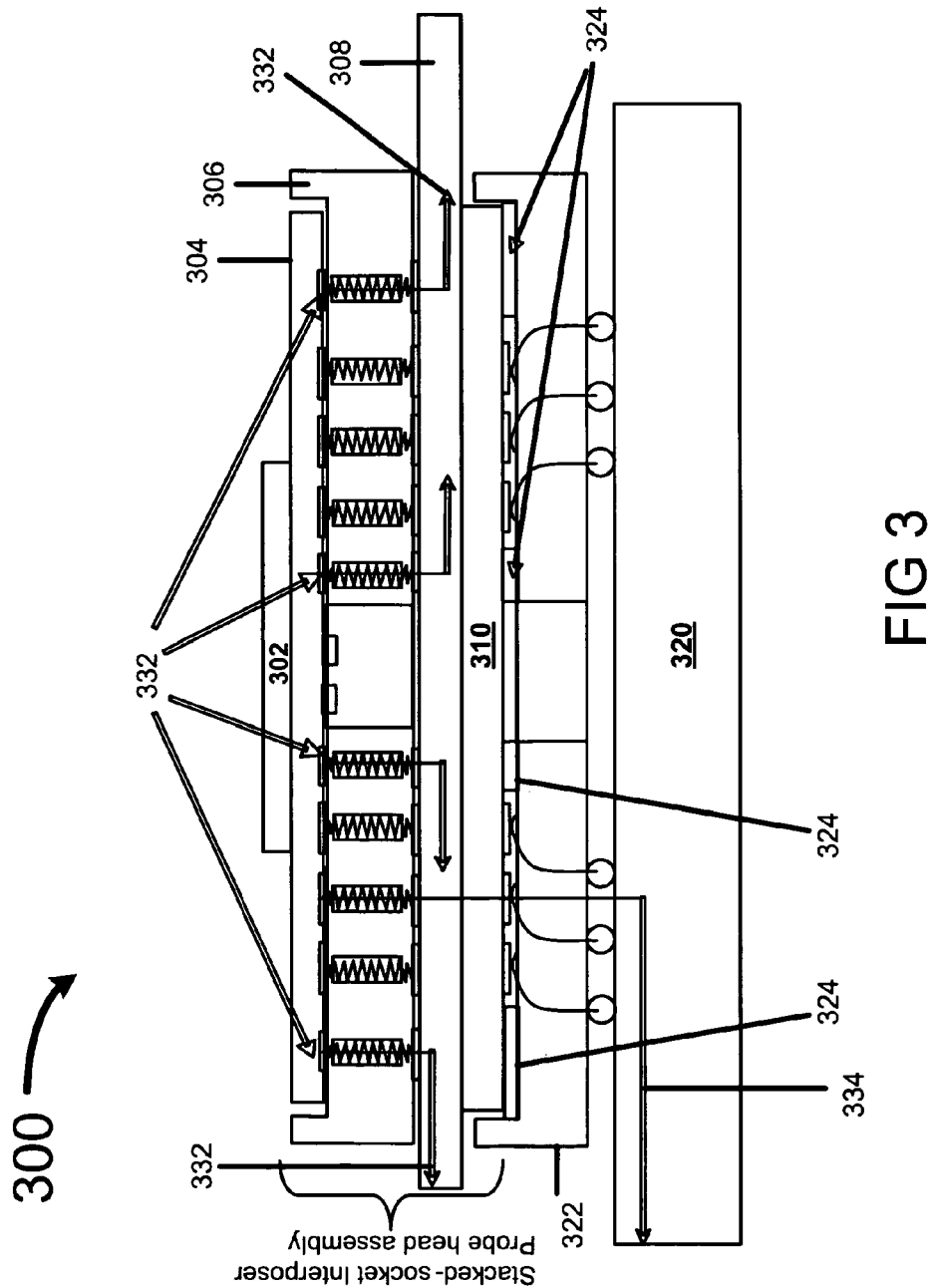
FIG. 3 illustrates a system according to some embodiments of the inventions.

FIG. 3 illustrates a system 300 according to some embodiments. In some embodiments, system 300 is a cross-sectional illustration of a stacked socket interposer probe breaking out debug signals not pinned out on a motherboard socket. For example, in some embodiments, system 300 includes an Integrated Circuit (IC) 302 (for example, a CPU), an Integrated Circuit (IC) package 304, a custom socket 306 (for example, a custom CPU socket), a probe interposer breakout board 308, a probe interposer header board 310, a motherboard 320, and an enabled socket 322 on the motherboard 320 (for example, an enabled CPU socket). In some embodiments, socket 306 on the probe interposer breakout board 308, the probe interposer breakout board 308, and the probe interposer header board 310 comprise a stacked-socket interposer probe head assembly. Enabled socket seating planes 324 are included on the socket 322. It is noted that the seating planes correspond to areas where non-system functional signals are not passed through to the socket 322 and/or motherboard 320.

In some embodiments, in order to access debug pins, for example, during a validation/debug of an IC product such as a CPU, debug probes referred to as stacked socket interposers are implemented. A stacked socket interposer debug probe is a board/socket assembly (for example, using socket 306, board 308, and/or header board 310) which may be inserted between a system and/or motherboard socket (for example, socket 322) and the IC package (for example, IC package 304). In some embodiments, the interposer includes a socket (for example, socket 306) to accept the package. It is noted that stacked-socket interposers are not constrained to use an enabled socket (for example, an LGA socket) on the motherboard. Therefore, custom probe sockets may be employed on these interposer probes according to some embodiments, where the custom probe sockets have pins populated on the depopulation zones to connect, for example, to the debug pins.

With a custom stacked socket according to some embodiments, the debug pins of the IC (for example, of IC 302) may be connected to the interposer probe and captured to the corresponding debug interface via the probe's interposer board (for example, interposer board 308). For example, as illustrated by arrows 332 in FIG. 3, a debug signal is "pinned out" in the IC package 304, probe socket 306, and interposer baseboard 308, but not in the enabled circuit (that is to the enabled socket 322). Arrows 334 illustrated in the motherboard 320 of FIG. 3 show other signals and power that are passed through the interposer board. That is, system functional signals are passed through to the socket 322 and motherboard 320 as illustrated by arrows 334, and non-system functional signals are not passed to the socket 322 and/or motherboard 320, but are passed through the stacked socket interposer probe head assembly including socket 306, board 308, and board 310 as illustrated in FIG. 3.

FIG. 4 illustrates a system 400 according to some embodiments. System 400 includes an IC 402, an IC package 404, a custom socket (for example, a custom CPU socket) 406, and a breakout board 408. In some embodiments, custom socket 406 is a custom socket on a tester and breakout board 408 is a tester breakout board.

In some embodiments, in a production test usage case, where certain dedicated production test signals are accessed prior to shipping a product such as IC 402, the production test apparatus includes a custom socket such as socket 406 which includes pins for dedicated test signals. With the custom socket in place on the test apparatus, those signals, along with other system-functional signals required for the test may be accessed by the test apparatus (for example, using socket 406 and/or board 408. Arrows 432 in FIG. 4 illustrate how test and/or debug signals may be pinned out in functional pin depopulation zones, routed through the IC package (for example, package 404 and/or a CPU package), the test socket (for example, socket 406), and the tester board (for example, board 410). In some embodiments, socket 406 and/or board 410 may be included in a logic analyzer, a probe device, and/or a tester, as well as any other type of testing, debug, or other device.

In some embodiments, the pins in FIG. 1 and FIG. 2 (for example, pins 102, 202, and/or 204) and/or pins illustrated in FIG. 3 and FIG. 4 are included in a bottom side of an IC package. In some embodiments, the pins in FIG. 1 and FIG. 2 (for example, pins 102, 202, and/or 204) and/or pins illustrated in FIG. 3 and FIG. 4 are included in a bottom side of a CPU package.

As described herein, IC product cost such as CPU product cost can include the cost of the package substrate. The larger the substrate the more it will cost. In CPU products, for example, the targeted substrate sizes as driven by cost targets impose pin count limits that barely exceed the number of pins necessary for system functionality (for example, for power, signaling main buses such as PCIE, memory, etc.). According to some embodiments, test and/or debug signals or other non-system functional signals that have an impact on the substrate size and therefore the product cost may be included in pin depopulation zones such that they do not require a larger size or extra pins in other areas of the package. In this manner, products with the same functionality, test, and debug coverage may be implemented at a lower cost than otherwise necessary.

Although some embodiments have been described herein as being according to certain implementations and/or embodiments, according to some embodiments these particular implementations may not be required.

Although some embodiments have been described in reference to particular implementations, other implementations are possible according to some embodiments. Additionally, the arrangement and/or order of circuit elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Some embodiments may be implemented in one or a combination of hardware, firmware, and software. Some embodiments may also be implemented as instructions stored on a machine-readable medium, which may be read and executed by a computing platform to perform the operations described herein. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other form of propagated signals (e.g., carrier waves, infrared signals, digital signals, the interfaces that transmit and/or receive signals, etc.), and others.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Although flow diagrams and/or state diagrams may have been used herein to describe embodiments, the inventions are not limited to those diagrams or to corresponding descriptions herein. For example, flow need not move through each illustrated box or state or in exactly the same order as illustrated and described herein.

The inventions are not restricted to the particular details listed herein. Indeed, those skilled in the art having the benefit of this disclosure will appreciate that many other variations from the foregoing description and drawings may be made within the scope of the present inventions. Accordingly, it is the following claims including any amendments thereto that define the scope of the inventions.

What is claimed is:

1. A socket comprising:
    a plurality of system functional pins;
    at least one system functional pin depopulation zone; and
    at least one non-system functional pin located in the at least one functional pin depopulation zone wherein the socket is included in a stacked-socket interposer probe head assembly.

2. A socket comprising:
    a plurality of system functional pins;
    at least one system functional pin depopulation zone;
    at least one non-system functional pin located in the at least one functional pin depopulation zone; and
    a stacked-socket interposer probe head assembly to receive a signal from the at least one non-system functional pin, and to pass system functional signals from an Integrated Circuit package to the socket.

3. The socket of claim 1, wherein the at least one functional pin depopulation zone is to be used to provide a mechanical seating between the package and a socket.

4. The socket of claim 1, wherein the at least one functional pin depopulation zone includes a plurality of functional pin depopulation zones.

5. The socket of claim 1, wherein the Integrated Circuit package is a Central Processing Unit package and the socket is a Central Processing Unit socket.

6. The socket of claim 1, wherein the at least one non-system functional pin includes one or more Input-Output pins, one or more debug pins, and/or one or more test pins.

* * * * *